US012596308B2

(12) United States Patent
Shervin et al.

(10) Patent No.: US 12,596,308 B2
(45) Date of Patent: Apr. 7, 2026

(54) MODULAR WAFER TABLE AND METHODS OF MANUFACTURING THEREOF

(71) Applicants: ASML Holding N.V., Veldhoven (NL); ASML Netherlands B.V., Veldhoven (NL)

(72) Inventors: Shahab Shervin, Norwalk, CT (US); Tammo Uitterdijk, Wilton, CT (US); Matthew Lipson, Stamford, CT (US); Marcus Martinus Petrus Adrianus Vermeulen, Leende (NL)

(73) Assignee: ASML Netherlands B.V., Veldhoven (NL)

( * ) Notice: Subject to any disclaimer, the term of this patent is extended or adjusted under 35 U.S.C. 154(b) by 89 days.

(21) Appl. No.: 18/562,770

(22) PCT Filed: Apr. 28, 2022

(86) PCT No.: PCT/EP2022/061381
§ 371 (c)(1),
(2) Date: Nov. 20, 2023

(87) PCT Pub. No.: WO2022/243005
PCT Pub. Date: Nov. 24, 2022

(65) Prior Publication Data
US 2024/0248415 A1 Jul. 25, 2024

Related U.S. Application Data

(60) Provisional application No. 63/190,579, filed on May 19, 2021.

(51) Int. Cl.
*G03F 7/20* (2006.01)
*G03F 7/00* (2006.01)
*H01L 21/687* (2006.01)

(52) U.S. Cl.
CPC ............ *G03F 7/707* (2013.01); *G03F 7/7095* (2013.01); *G03F 7/70975* (2013.01); *H01L 21/6875* (2013.01)

(58) Field of Classification Search
CPC .... G03F 7/707; G03F 7/7095; G03F 7/70975; H01L 21/6875
See application file for complete search history.

(56) References Cited

U.S. PATENT DOCUMENTS

| | | | |
|---|---|---|---|
| 7,511,799 B2 | 3/2009 | Tel et al. | |
| 2007/0097346 A1 | 5/2007 | Maria Zaal et al. | |

(Continued)

FOREIGN PATENT DOCUMENTS

| | | |
|---|---|---|
| JP | 2006-054289 A | 2/2006 |
| KR | 101328492 B1 | 11/2013 |

(Continued)

OTHER PUBLICATIONS

International Search Report and Written Opinion of the International Searching Authority directed to International Patent Application No. PCT/EP2022/061381, mailed Sep. 2, 2022; 12 pages.

(Continued)

*Primary Examiner* — Mesfin T Asfaw
(74) *Attorney, Agent, or Firm* — Finnegan, Henderson, Farabow, Garrett & Dunner LLP

(57) ABSTRACT

The present disclosure is directed to a modular wafer table and methods for refurbishing a scrapped wafer to manufacture the modular wafer table. The method comprises removing one or more burls from a surface of a wafer table; polishing the surface of the wafer table after removing the one or more burls to form a core module; forming a burl module having a plurality of burls thereon; and bonding the core module to the burl module.

20 Claims, 6 Drawing Sheets

(56) References Cited

U.S. PATENT DOCUMENTS

| | | | |
|---|---|---|---|
| 2015/0029485 A1* | 1/2015 | Lafarre | .................. B22F 10/00 |
| | | | 355/72 |
| 2015/0380294 A1 | 12/2015 | Glasko et al. | |
| 2017/0036272 A1 | 2/2017 | Lafarre et al. | |
| 2019/0366459 A1 | 12/2019 | Elliot et al. | |
| 2023/0075771 A1 | 3/2023 | Baltis et al. | |

FOREIGN PATENT DOCUMENTS

| | | |
|---|---|---|
| TW | 202101641 A | 1/2021 |
| WO | WO 2019/081174 A1 | 5/2019 |
| WO | WO 2020/135971 A1 | 7/2020 |
| WO | WO 2021/170320 A1 | 9/2021 |

OTHER PUBLICATIONS

International Preliminary Report on Patentability directed to International Patent Application No. PCT/EP2022/061381, issued Nov. 21, 2023; 8 pages.
Research Disclosure No. 591076, Disclosed Anonymously, Jun. 21, 2013; 6 pages.
"Low Temperature Bonding of Dissimilar Bodies Using "Solder/Glue Dot" Patterns," Research Disclosure No. 673039, Disclosed Anonymously, Apr. 9, 2020; 3 pages.
"Wafer Clamp Hard Burl Production and Refurbishment," Research Disclosure No. 681007, Disclosed Anonymously, Nov. 25, 2020; 33 pages.
"Modular Wafer Table and Methods of Manufacturing Thereof," Research Disclosure No. 687021, Disclosed Anonymously, Jun. 3, 2021; 25 pages.

* cited by examiner

100

600

602

Remove one or more burls from a surface of a wafer table

604

Polish the surface of the wafer table after removing the one or more burls to form a core module

606

Form a burl module having a plurality of burls thereon

608

Bond the core module to the burl module

MODULAR WAFER TABLE AND METHODS OF MANUFACTURING THEREOF

CROSS-REFERENCE TO RELATED APPLICATIONS

This application claims priority of U.S. Provisional Patent Application No. 63/190,579, which was filed on May 19, 2021, and which is incorporated herein in its entirety by reference.

FIELD

The present disclosure relates to lithographic systems, for example, a modular wafer table and methods for refurbishing a scrapped wafer to manufacture the modular wafer table.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

During lithographic operation, different processing steps may require different layers to be sequentially formed on the substrate. Sequencing of layers is typically accomplished by exchanging different reticles, according to the desired pattern for each layer, for each pattern transfer process. A typical lithographic system works within sub-nanometer tolerances regarding patterns on the reticle and patterns transferred onto the wafer from the reticle.

SUMMARY

There is a need to refurbish scrapped wafer tables.

In some embodiments, a method includes the following operations. Removing one or more burls from a surface of a wafer table. Polishing the surface of the wafer table after removing the one or more burls to form a core module.

Forming a burl module having a plurality of burls thereon. Bonding the core module to the burl module.

In some embodiments, a wafer table includes the following components. A core module configured to be formed by removing one or more burls from a surface of a wafer table and polishing the surface of the wafer table after removing the one or more burls. A burl module having a plurality of burls formed thereon. A plurality of bonding contacts configured to bond the core module to the burl module In some embodiments, a method includes the following operations for forming a core module. Removing one or more burls from a surface of a wafer table by mechanically grinding the one or more burls. Polishing the surface of the wafer table after removing the one or more burls using a chemical-mechanical polishing (CMP) process. Forming a burl module having a plurality of burls. Bonding the core module to the burl module using such techniques as optical contacting/bonding, solder bonding, adhesive bonding, eutectic bonding, anodic bonding, metal-metal diffusion bonding, and the like.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

Figure 1A:
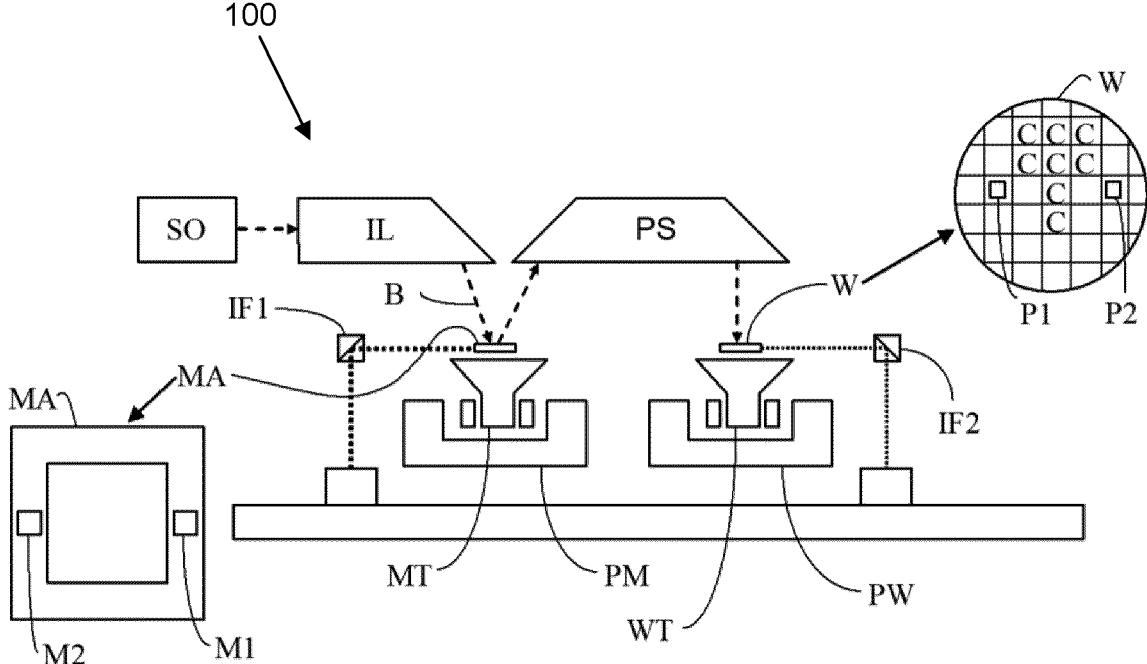
FIG. 1A shows a schematic of a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc. The term "non-transitory" may be used herein to characterize computer readable media used for storing data, information, instructions, and the like, with the sole exception being a transitory, propagating signal.

Before describing such embodiments in more detail, however, it is instructive to present an example environment in which embodiments of the present disclosure can be implemented.

Example Lithographic Systems

Figure 1B:
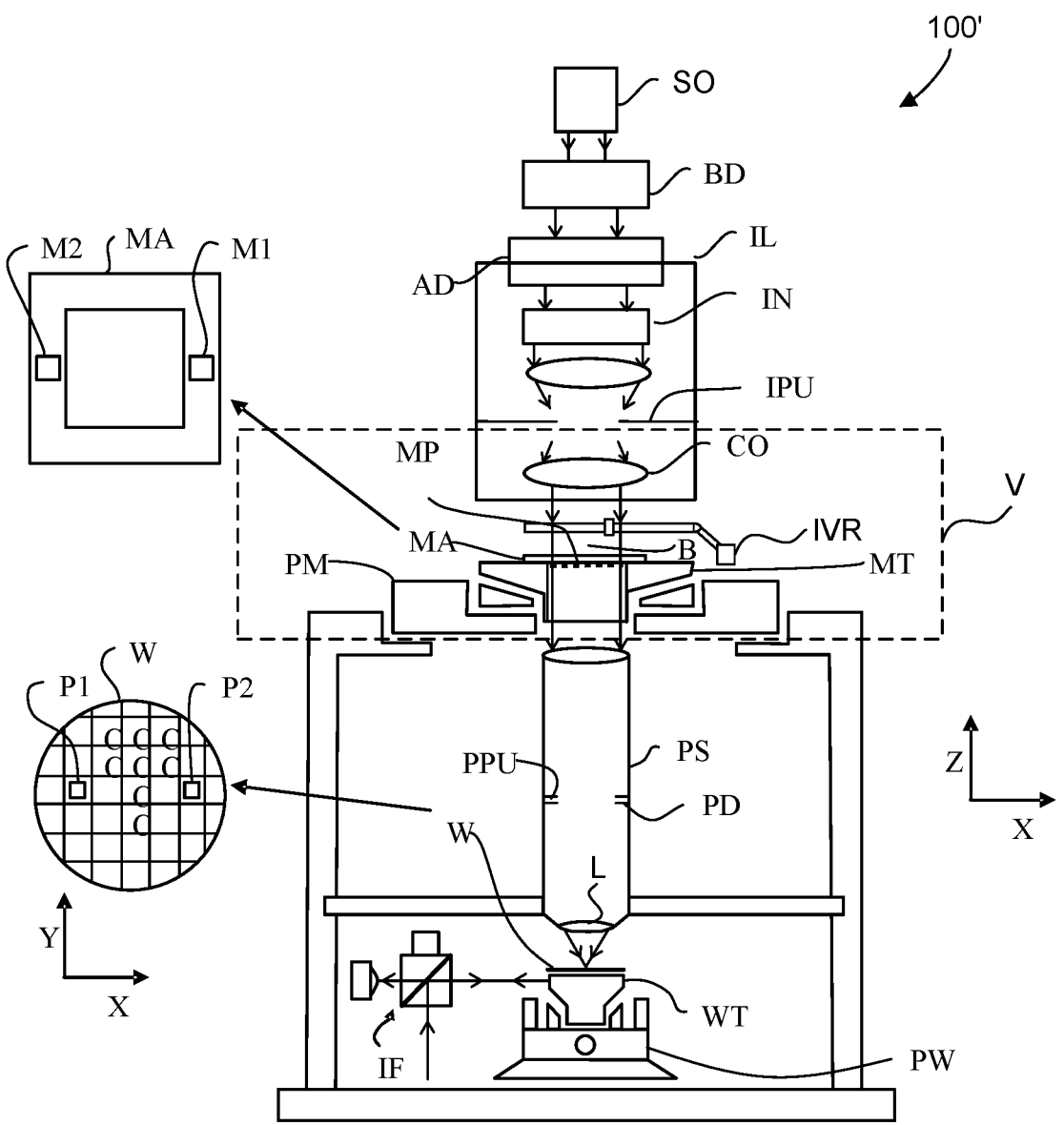
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B, which is reflected by a matrix of small mirrors.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such "multiple stage" machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' may be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO may be an integral part of the lithographic apparatus 100, 100', for example, when the source SO is a mercury lamp. The source SO and the illuminator IL, together with the beam delivery system BD, if required, may be referred to as a radiation system.

The illuminator IL may include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. In addition, the illuminator IL may comprise various other components (in FIG. 1B), such as an integrator IN and a condenser CO. The illuminator IL may be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT may be moved accurately (for example, so as to position different target portions C in the path of the radiation beam B). Similarly, the first positioner PM and another position sensor IF1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT may be moved accurately (for example, so as to position different target portions C in the path of the radiation beam B). Similarly, the first positioner PM and another position sensor (not shown in FIG. 1B) may be used to accurately position the mask MA with respect to the path of the radiation beam B (for example, after mechanical retrieval from a mask library or during a scan).

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only or may be fixed. Mask MA and substrate W may be aligned using mask alignment marks M1, M2, and substrate alignment marks P1, P2. Although the substrate alignment marks (as illustrated) occupy dedicated target portions, they may be located in spaces between target portions (known as scribe-lane alignment marks). Similarly, in situations in which more than one die is provided on the mask MA, the mask alignment marks may be located between the dies.

Mask table MT and patterning device MA may be in a vacuum chamber V, where an in-vacuum robot IVR may be used to move patterning devices such as a mask in and out of vacuum chamber. Alternatively, when mask table MT and patterning device MA are outside of the vacuum chamber, an out-of-vacuum robot may be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' may be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In some embodiments, a lithographic apparatus may generate DUV and/or EUV radiation. For example, lithographic apparatus 100' may be configured to operate using a DUV source. In another example, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
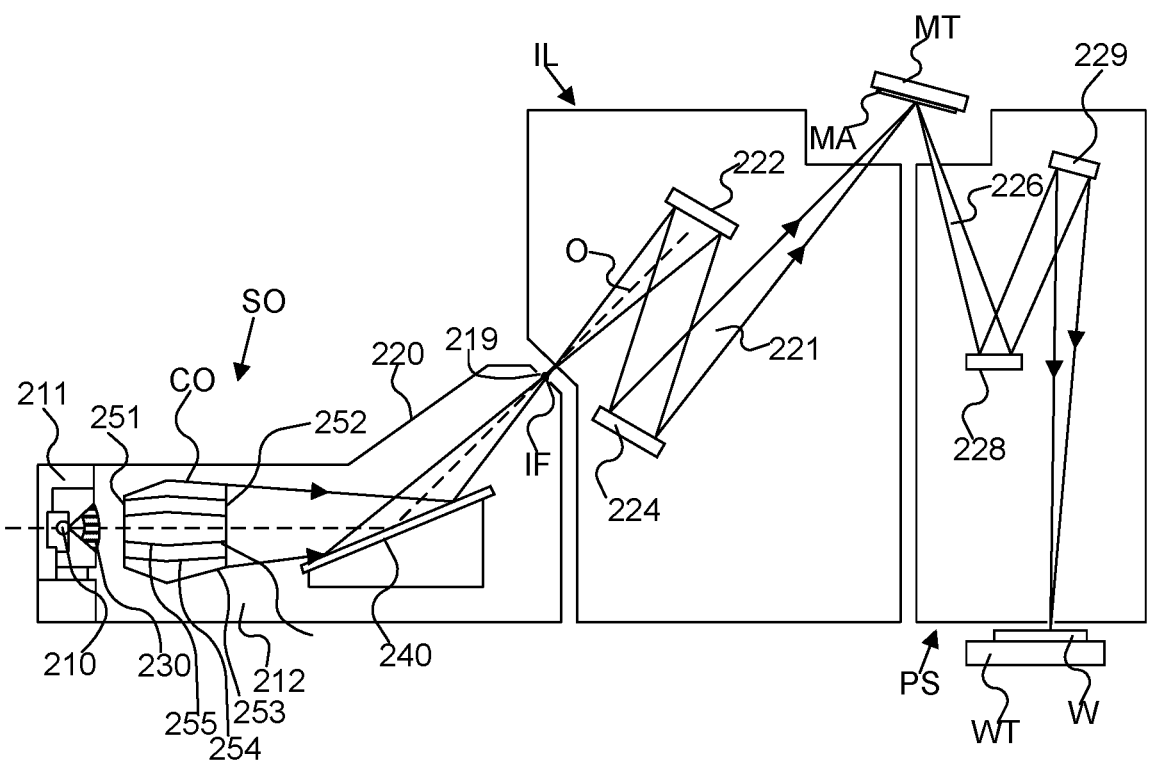
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment may be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which may be a so-called grazing incidence collector. Radiation collector CO has an upstream radiation collector side 251 and a downstream radiation collector side 252. Radiation that traverses collector CO may be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
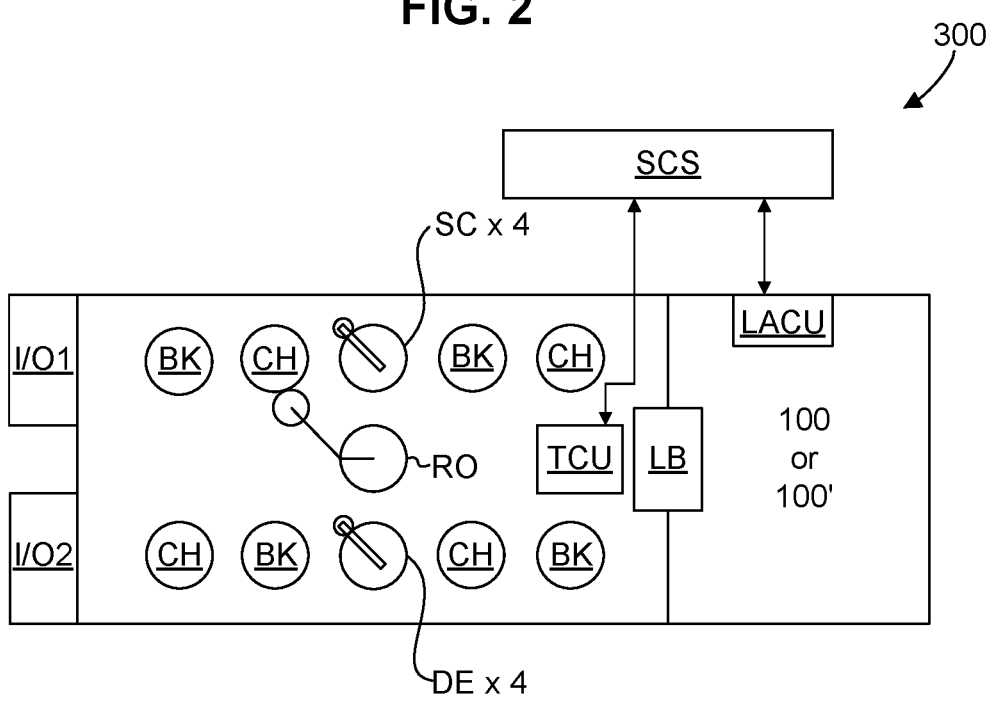
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Exemplary Apparatus

In some embodiments, a wafer table is used to support a wafer during measurement, alignment, and exposure during lithographic processes. For example, for both immersion and dry processes, wafer tables function as a surface that contacts a wafer in a lithographic apparatus, such as the lithographic apparatus shown in FIG. 1A or FIG. 1B. Wafer tables may include a plurality of burls that minimize a contact surface to the wafer, provide a flat interface to secure wafer flatness, and provide defined roughness to minimize wafer load grid.

Current processes for manufacturing wafer tables can include serial production steps that increase a cycle time of production and increase a cost of producing the wafer tables. The processes for manufacturing wafer tables can yield a high number of scrapped wafer tables that cannot be used. The current processes for manufacturing wafer tables can limit the ability to apply high temperature coatings on the burls due to limitations of bonding used in existing wafer tables. Applying elevated temperatures (e.g., up to 900° C.) to grow high quality materials and new coatings (new materials with desired properties) on top of the existing wafer tables may be challenging due to the instabilities in the scrapped wafer table material at these high temperatures.

Figure 4:
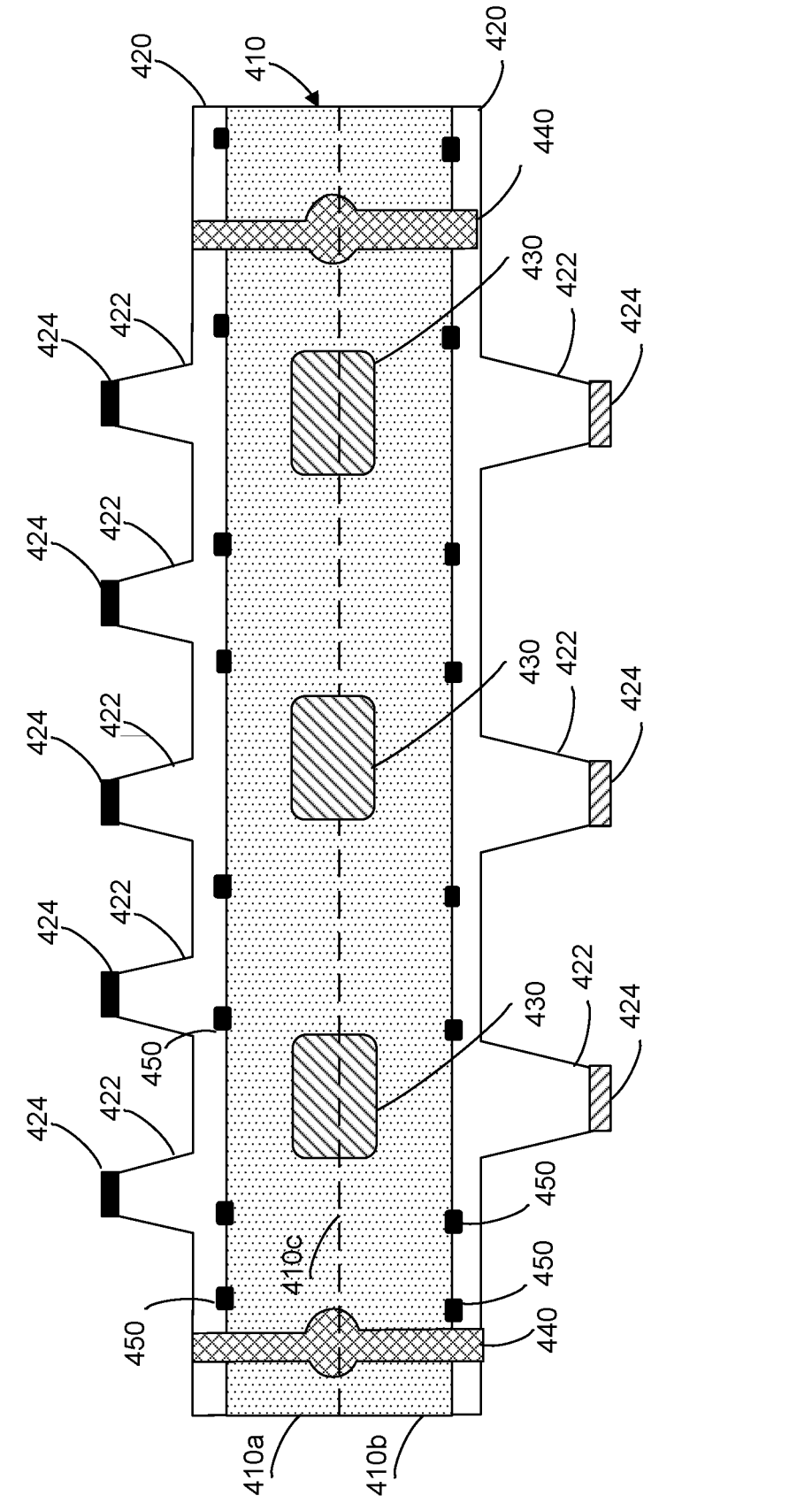
FIG. 4 shows an example modular wafer table, according to some embodiments.

FIG. 4 shows a schematic of a wafer table 400, according to some embodiments. In some embodiments, wafer table 400 may be implemented in a lithographic apparatus, e.g., lithographic apparatus 100 and/or 100'.

The wafer table 400 may include a core module 410, one or more burl modules 420, one or more cooling channels 430, a back-fill gas (BFG) system 440, and one or more bonding contacts 450. In some embodiments, wafer table

400 may be manufactured using parallel processing steps for manufacturing the core module 410 and the one or more burl modules 420.

Figure 5:
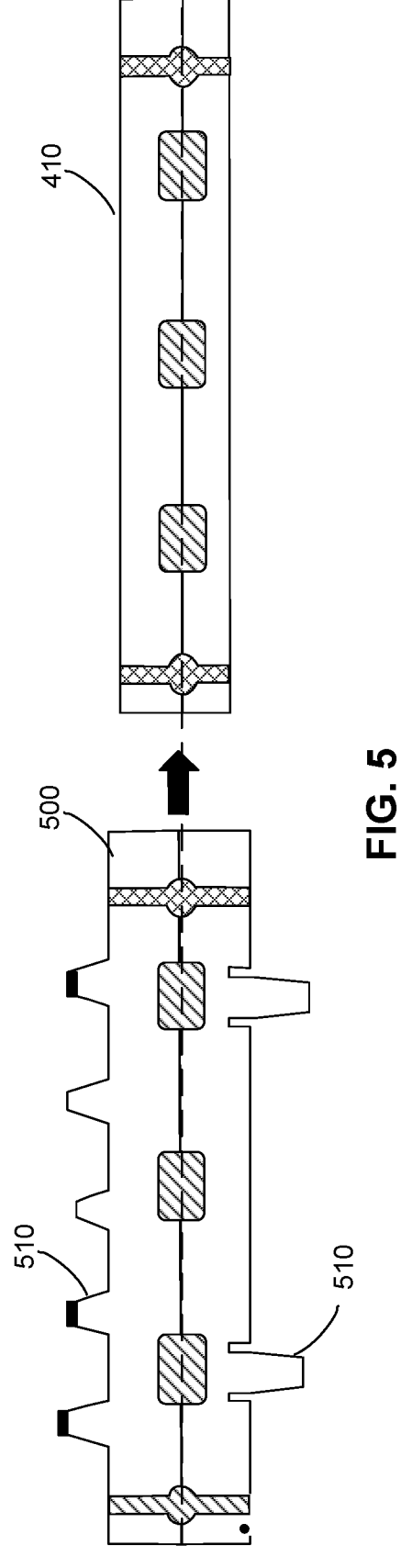
FIG. 5 shows an example process of refurbishing a scrapped wafer table, according to some embodiments.

For example, as illustrated in FIG. 5, the core module 410 may be formed (e.g., manufactured) using a scrapped wafer table 500. With continuing reference to FIGS. 4 and 5, in some embodiments, the core module 410 may be manufactured by removing (e.g., removing by mechanically grinding) burls 510 from a top and/or a bottom surface of the scrapped wafer table 500. The burls 510 may be integrated with the scrap wafer table 500 and referred to as integrated burls. In some embodiments, the burls 510 removed from the scrapped wafer table 500 may not be integrated with the scrap wafer table 500.

Mechanically grinding the burls 510 may be performed using any suitable technique for grinding a material, e.g., siliconized silicon carbide (SiSiC).

Manufacturing the core module 410 may also include polishing the scrapped wafer table 500 after removing the burls 510. For example, polishing the scrapped wafer 500 table may include a chemical-mechanical polishing (CMP) process. It should be understood by those of ordinary skill in the art that this is merely an example polishing process and that other polishing processes are further contemplated in accordance with aspects of the present disclosure.

In some embodiments, the one or more burl modules 420 may be formed (e.g., manufactured) in a separate manufacturing process. For example, the one or more burl modules 420 may be manufactured on a second substrate, as should be understood by those of ordinary skill in the art.

In some embodiments, manufacturing the one or more burl modules 420 on a separate substrate allows for using a different material than a material used for the core module 410. For example, the core module 410 may be manufactured using SiSiC, while the one or more burl modules 420 may be manufactured using a different material than a material used for the core module 410. As another example, the different material may have a different crystalline structure on a substrate than a material used for the core module 410. For example, the one or more burl modules 420 may be manufactured using silicon (Si), sapphire, silicon carbide (SiC), etc. It should be understood by those of ordinary skill in the art that these are merely examples of materials that may be used for the one or more burl modules and that other materials are further contemplated in accordance with aspects of the present disclosure.

In some embodiments, the one or more burl modules 420 may be manufactured using the same material as the core module 410.

In some embodiments, as the core module 410 is manufactured using a scrapped wafer table, the core module 410 includes an upper layer 410a and a lower layer 410b bonded to one another using a bonding 410c. As illustrated in FIG. 4, the burls 422 of the burl module 420 bonded to the upper layer 410a may be a different size and shape than the burls 422 of the burl module 420 bonded to the lower layer 410b.

Additionally, as burl modules 420 may be manufactured in separate processes, the coating 424 of the burls 422 of burl module 420 bonded to the upper layer 410a may be a different material than the coating 424 of the burls 422 of burl module 420 bonded to the lower layer 410b.

In some embodiments, as the one or more burl modules 420 may be manufactured separately, the coating 424 on each burl 422 of the one or more burl modules 420 may be applied using elevated temperatures (e.g., up to 900° C.). Namely, the bonding 410c is no longer a limiting factor in the temperatures at which the coating 424 can be applied, and as a result, the coating 424 may be a high temperature coating applied to the burls 422. For example, the high temperature coating may be a coating that requires a temperature greater than 420° C. As one example, the high temperature coating may be a high temperature diamond coating that requires 600° C. According to some embodiments, the segmentation of the manufacturing process can allow the application of higher temperatures at which the coating 424 can be applied to the one or more burl modules 420 without affecting any structural instabilities/sensitivities associated with a bonding within the core module 410.

In some embodiments, the wafer table 400 may be formed by bonding the core module 410 and the one or more burl modules 420 to one another. Bonding the core module 410 to the one or more burl modules 420 may be done using such techniques as optical contacting, solder bonding, adhesive bonding, eutectic bonding, anodic bonding, metal-metal diffusion bonding, and/or a combination thereof.

Thus, some embodiments of the present disclosure provide for a manufacturing process for manufacturing the wafer table 400 in separate manufacturing steps, e.g., the core module 410 and the one or more burl modules 420 being manufactured separately from one another. For example, the core module 410 may be manufactured by refurbishing scrapped wafer tables and the one or more burl modules 420 may be manufactured in parallel on a separate substrate. After the core module 410 and the one or more burls modules 420 are separately manufactured, the core module 410 and the one or more burl modules 420 may be bonded to one another to form the wafer table 400.

Figure 6:
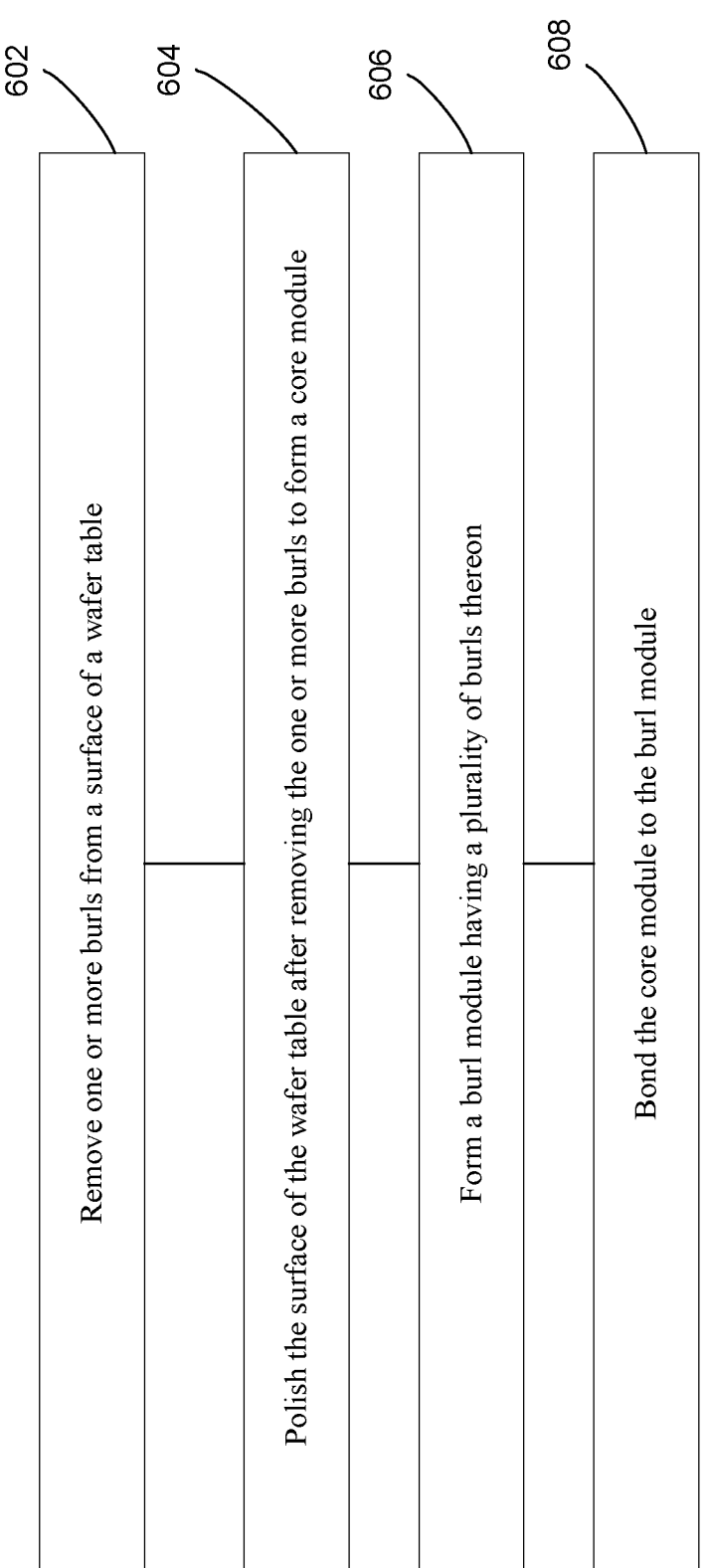
FIG. 6 shows an example process for use in manufacturing of modular wafer tables, according to some embodiments.

FIG. 6 shows an example method 600, according to some embodiments. In one example, method 600 can be used to manufacture a modular wafer table. It is to be appreciated that not all steps can be needed to perform the disclosure provided herein. Further, some of the steps can be performed simultaneously, or in a different order than shown in FIG. 6, as will be understood by a person of ordinary skill in the art.

At step 602, one or more burls may be removed from a surface of a wafer table. The removing may include mechanically grinding the one or more burls.

At step 604, the surface of the wafer table may be polished after removing the one or more burls to form a core module. According to some embodiments, the polishing may include using a chemical-mechanical polishing (CMP) process.

At step 606, a burl module may be formed that has a plurality of burls thereon. In some embodiments, forming a burl module separately from a core module can allow for the ability to use different materials applied at different (e.g., high) temperatures that may not impact the core module.

In step 608, the core module may be bonded to the burl module. According to some embodiments, bonding the core module to the burl module may include bonding using solder bonding or optical contact.

According to some embodiments, method 600 may further include forming a high temperature coating on each burl of the plurality of burls. In a non-limiting example, the high temperature coating may be a high temperature diamond coating for example. According to some embodiments, method 600 may further include manufacturing the burl module using a same or a different material than a material used for the core module.

It can be appreciated that the proposed manufacturing method for WT in separate manufacturing steps provides a series of benefits and cost savings to existing manufacturing processes. It can also be appreciated that the separate manufacturing steps (e.g., of burl structures and core structures) can be done separately and/or simultaneously, thereby reducing manufacturing times. According to some embodiments, the separate manufacturing process provided herein allows for the application of high temperature coatings on top of the burl structure. The separate manufacturing processes can allow for decoupling of the burl structures from any instabilities associated with the core structure and/or associated bonding. This, in turn, can allow for use of a new field of material that can be used to manufacture the burls. For example, the burls can be manufactured on different robust materials with different crystalline structures. As such, properties of the burls can be engineered independently of the structure/material of the core. According to some embodiments, the separate manufacturing processes can reduce the current cycle time for existing WT manufacturing processes and can reduce manufacturing costs by enabling refurbishment of existing scrap WTs (where burl patterns can be removed by proper grinding and polishing steps). Accordingly, new coatings such as high temperature diamond can be coated on the burls—thereby enabling the manufacture of more robust burls with better control over their mechanical/tribo-mechanical properties.

In some embodiments, the proposed modular WT manufacturing process described herein can allow for the integration of new material and new coatings to the existing WT technology—thereby improving wafer load grid (WLG) and overlay issues due to manufacturing more robust burls. In some embodiments, this can also allow the manufacture of crystalline structure of burl modules to be further engineered using single crystalline substrates.

The embodiments may further be described using the following clauses:

1. A method, comprising:
      removing one or more burls from a surface of a wafer table;
      polishing the surface of the wafer table after removing the one or more burls to form a core module;
      forming a burl module having a plurality of burls thereon; and
      bonding the core module to the burl module.

2. The method of clause 1, wherein the bonding the core module to the burl module comprises bonding the core module and the burl module using optical contact.

3. The method of clause 1, wherein the bonding the core module to the burl module comprises bonding the core module and the burl module using solder bonding.

4. The method of clause 1, wherein:
      the removing comprises mechanically grinding the one or more burls; and
      the polishing comprises using a chemical-mechanical polishing (CMP) process.

5. The method of clause 1, further comprising forming a high temperature coating on each burl of the plurality of burls.

6. The method of clause 5, wherein the high temperature coating is a high temperature diamond coating.

7. The method of clause 1, further comprising manufacturing the burl module using a different material than a material used for the core module.

8. The method of clause 1, further comprising manufacturing the burl module using a same material as a material used for the core module.

9. A wafer table, comprising:
      a core module configured to be formed by removing one or more burls from a surface of a wafer table and polishing the surface of the wafer table after removing the one or more burls;

a burl module having a plurality of burls formed thereon; and a plurality of bonding contacts configured to bond the core module to the burl module.

10. The wafer table of clause 9, wherein the plurality of bonding contacts comprise a plurality of optical contacts.

11. The wafer table of clause 9, wherein the plurality of bonding contacts comprise a plurality of solder bonding contacts.

12. The wafer table of clause 9, wherein the burl module comprises a high temperature coating formed on each burl of the plurality of burls.

13. The wafer table of clause 12, wherein the high temperature coating comprises a high temperature diamond coating.

14. The wafer table of clause 9, wherein the burl module comprises a different material than a material used for the core module.

15. The wafer table of clause 9, wherein the burl module comprises a same material as a material used for the core module.

16. The wafer table of clause 9, wherein the core module comprises an upper layer and a lower layer bonded to one another.

17. The wafer table of clause 9, wherein the plurality of bonding contacts comprise adhesive bonding, eutectic bonding, anodic bonding, metal-metal diffusion bonding, or anodic bonding.

18. A method, comprising:

forming a core module by:

removing one or more burls from a surface of a wafer table by mechanically grinding the one or more burls; and polishing the surface of the wafer table after removing the one or more burls using a chemical-mechanical polishing (CMP) process;

forming a burl module having a plurality of burls; and bonding the core module to the burl module using an optical contact or a solder bond.

19. The method of clause 18, wherein the forming a burl module further comprises forming a high temperature coating on each burl of the plurality of burls prior to bonding the core module to the burl module.

20. The method of clause 19, wherein the high temperature coating is a high temperature diamond coating.

21. The method of clause 18, wherein the burl module is using a different material than a material used for the core module.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electro-magnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the present disclosure have been described above, it will be appreciated that the present disclosure can be practiced otherwise than as described. The description is not intended to limit the present disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of protected subject matter should not be limited by any of the above-described exemplary embodiments, but should be defined only in accordance with the following claims and their equivalents.

The invention claimed is:

1. A method, comprising:
removing burls from a surface of a wafer table;
polishing the surface of the wafer table after removing the burls to form a core;
forming a plurality of burls on a separate substrate; and
bonding the core to the substrate.

2. The method of claim 1, wherein the bonding the core to the substrate comprises bonding the core and the substrate using optical contact.

3. The method of claim 1, wherein the bonding the core to the substrate comprises bonding the core and the substrate using solder bonding.

4. The method of claim 1, wherein:
the removing comprises mechanically grinding the burls; and
the polishing comprises using a chemical-mechanical polishing (CMP) process.

5. The method of claim 1, further comprising forming a high temperature coating on each burl of the plurality of burls at a temperature of up to 900 degrees Celsius, wherein the high temperature coating comprises a high temperature diamond coating.

6. The method of claim 1, further comprising manufacturing the substrate using a different material than a material used for the core.

7. The method of claim 1, further comprising manufacturing the substrate using a same material as a material used for the core.

8. A wafer table, comprising:
a core comprising a surface that is configured to have all burls removed before polishing the surface;
a substrate comprising a plurality of burls formed thereon; and
a plurality of bonding contacts configured to bond together the core to the substrate.

9. The wafer table of claim 8, wherein the plurality of bonding contacts comprise a plurality of optical contacts.

10. The wafer table of claim 8, wherein the plurality of bonding contacts comprise a plurality of solder bonding contacts.

11. The wafer table of claim 8, wherein:
the substrate comprises a high temperature coating formed on each burl of the plurality of burls at a temperature of up to 900 degrees Celsius; and
the high temperature coating comprises a high temperature diamond coating.

12. The wafer table of claim 8, wherein the substrate comprises a different material than a material used for the core.

13. The wafer table of claim 8, wherein the substrate comprises a same material as a material used for the core.

14. The wafer table of claim 8, wherein the core comprises an upper layer and a lower layer bonded to one another.

15. The wafer table of claim 8, wherein the plurality of bonding contacts comprise adhesive bonding, eutectic bonding, anodic bonding, or metal-metal diffusion bonding.

16. A lithographic apparatus, comprising:
an illumination system configured to condition a radiation beam;
a projection system configured to project a pattern imparted to the radiation beam by a patterning device onto a target portion of a wafer;
a wafer table configured to hold the wafer, the wafer table comprising:
a core comprising a polished surface without burls;
a substrate comprising a plurality of burls formed thereon; and
a plurality of bonding contacts configured to bond together the core to the substrate.

17. The lithographic apparatus of claim 16, wherein:
the substrate comprises a high temperature coating formed on each burl of the plurality of burls at a temperature of up to 900 degrees Celsius; and
the high temperature coating comprises a high temperature diamond coating.

18. The lithographic apparatus of claim 16, wherein the substrate comprises a different material than a material used for the core or a same material as the material used for the core.

19. The lithographic apparatus of claim 16, wherein the core comprises an upper layer and a lower layer bonded to one another.

20. The lithographic apparatus of claim 16, wherein the plurality of bonding contacts comprise optical contacting, solder bonding, adhesive bonding, eutectic bonding, anodic bonding, or metal-metal diffusion bonding.

* * * * *